US008815711B2

(12) United States Patent
Suzuki et al.

(10) Patent No.: US 8,815,711 B2
(45) Date of Patent: Aug. 26, 2014

(54) MANUFACTURING APPARATUS AND METHOD FOR SEMICONDUCTOR DEVICE AND CLEANING METHOD OF MANUFACTURING APPARATUS FOR SEMICONDUCTOR

(75) Inventors: Kunihiko Suzuki, Shizuoka-ken (JP); Hideki Ito, Numazu (JP); Hidekazu Tsuchida, Kanagawa (JP); Isaho Kamata, Kanagawa (JP); Masahiko Ito, Kanagawa (JP)

(73) Assignees: NuFlare Technology, Inc., Numazu-shi, Shizuoka-ken (JP); Denso Corporation, Kariya, Aichi-Pref. (JP); Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 569 days.

(21) Appl. No.: 13/160,209

(22) Filed: Jun. 14, 2011

(65) Prior Publication Data

US 2011/0312187 A1 Dec. 22, 2011

(30) Foreign Application Priority Data

Jun. 22, 2010 (JP) ................................ 2010-141419
Apr. 28, 2011 (JP) ................................ 2011-100478

(51) Int. Cl.

*H01L 21/20* (2006.01)
*H01L 21/36* (2006.01)
*H01L 21/31* (2006.01)
*H01L 21/469* (2006.01)
*B08B 17/02* (2006.01)
*H01L 21/67* (2006.01)
*C23C 16/44* (2006.01)
*H01L 21/205* (2006.01)

(52) U.S. Cl.

CPC .......... *B08B 17/02* (2013.01); *H01L 21/67109* (2013.01); *C23C 16/4412* (2013.01); *C23C 16/4405* (2013.01)
USPC .................. 438/478; 438/758; 257/E21.101; 257/E21.461

(58) Field of Classification Search

CPC .................. H01L 21/02041; H01L 21/02076; H01L 21/02252; H01L 21/0226; H01L 21/02263; H01L 21/02271; H01L 21/02; H01L 21/274; H01L 21/02277; H01L 21/0228; H01L 21/02301; H01L 21/02334; H01L 21/02337; H01L 21/0234; H01L 21/223; H01L 21/2252
USPC ......... 438/478, 485–487, 503, 505, 507–508, 438/758–794; 257/E21.101–E21.113, 257/E21.141–E21.152, E21.461–E21.475
See application file for complete search history.

(56) References Cited

U.S. PATENT DOCUMENTS 5,884,009 A 3/1999 Okase
6,432,838 B1 * 8/2002 Choi et al. .................... 438/758

(Continued)

FOREIGN PATENT DOCUMENTS

JP 2007-67422 3/2007
JP 2008-235585 10/2008

(Continued)

*Primary Examiner* — Calvin Choi
(74) *Attorney, Agent, or Firm* — Finnegan, Henderson, Farabow, Garrett & Dunner, L.L.P.

(57) ABSTRACT

A manufacturing apparatus for a semiconductor device, including: a reaction chamber configured to perform film formation on a wafer; a process gas supplying mechanism provided in an upper part of the reaction chamber and configured to introduce process gas to an interior of the reaction chamber; a gas discharging mechanism provided in a lower part of the reaction chamber and configured to discharge gas from the reaction chamber; a supporting member configured to hold the wafer; a cleaning gas supplying mechanism provided in an outer periphery of the supporting member and configured to emit cleaning gas in an outer periphery direction below an upper end of the supporting member; a heater configured to heat the wafer; and a rotary driving mechanism configured to rotate the wafer.

20 Claims, 3 Drawing Sheets

(56) References Cited

U.S. PATENT DOCUMENTS

| | | | | |
|---|---|---|---|---|
| 2009/0042321 | A1* | 2/2009 | Sasaki et al. | 438/10 |
| 2009/0111278 | A1* | 4/2009 | Yajima et al. | 438/758 |
| 2009/0291566 | A1* | 11/2009 | Ueno et al. | 438/758 |
| 2009/0324826 | A1 | 12/2009 | Kato et al. | |

FOREIGN PATENT DOCUMENTS

| | | |
|---|---|---|
| JP | 2009-152521 | 7/2009 |
| KR | 10-0497187 | 10/2005 |
| KR | 10-2010-0002221 | 1/2010 |

* cited by examiner

MANUFACTURING APPARATUS AND METHOD FOR SEMICONDUCTOR DEVICE AND CLEANING METHOD OF MANUFACTURING APPARATUS FOR SEMICONDUCTOR

CROSS-REFERENCE TO RELATED APPLICATION

This application is based upon and claims the benefit of priority from the prior Japanese Patent Applications No. 2010-141419 filed on Jun. 22, 2010 and No. 2011-100478 filed on Apr. 28, 2011, the entire contents of which are incorporated herein by reference.

BACKGROUND

The present invention relates to a manufacturing apparatus for a semiconductor device, a manufacturing method for a semiconductor device and a cleaning method of a manufacturing apparatus for a semiconductor device for use in, for example, supplying reactive gas onto a surface while heating a semiconductor wafer from its reverse so as to form a film.

In recent years, a high quality has been required in addition to high productivity in a film forming process accompanied with a request for cost reduction and high performance of a semiconductor device.

With, for example, a manufacturing apparatus for semiconductor device which performs epitaxial growth by supplying process gas from above of a wafer, heating backside of the wafer and rotating the wafer, excessive process gas and reaction by-product are discharged downward from the wafer end. By the way, there are problems that the reaction by-product is deposited in an exhaust system such as a reaction chamber and pump, thereby producing dust or causing a clog in the exhaust system, and therefore a yield decreases.

Hence, Japanese Patent Application Laid-Open No. 2007-67422 proposes removing a deposition in a reaction chamber using cleaning gas on a regular basis. However, when an apparatus is stopped once to perform cleaning, the productivity significantly decreases. Further, it is necessary to use highly reactive gas such as $ClF_3$ as cleaning gas in processing of forming SiC films, and consider safety by completely discharging $H_2$ gas which explosively reacts with the highly reactive gas.

SUMMARY

A manufacturing apparatus for a semiconductor device according to an aspect of the present invention includes: a reaction chamber configured to perform film formation on a wafer; a process gas supplying mechanism provided in an upper part of the reaction chamber and configured to introduce process gas to an interior of the reaction chamber; a gas discharging mechanism provided in a lower part of the reaction chamber and configured to discharge gas from the reaction chamber; a supporting member configured to hold the wafer; a cleaning gas supplying mechanism provided in an outer periphery of the supporting member and configured to emit cleaning gas in an outer periphery direction below an upper end of the supporting member; a heater configured to heat the wafer; and a rotary driving mechanism configured to rotate the wafer.

A manufacturing method for semiconductor device includes: loading a wafer into a reaction chamber and placing the wafer on a supporting member; supplying process gas including source gas and carrier gas on a surface of the wafer; rotating and heating the wafer and forming a film on a surface of the wafer; and discharging excessive process gas and a reaction by-product below an outer periphery of the wafer, and supplying cleaning gas in an outer periphery direction below an upper end of the supporting member.

A cleaning method of a manufacturing apparatus for semiconductor device according to an aspect of the present invention includes supplying cleaning gas from an upper part of a reaction chamber configured to perform film formation on a wafer, and an outer periphery direction below an upper end of a supporting member configured to support the wafer to remove a deposition in the reaction chamber.

DETAILED DESCRIPTION

Reference will now be made in detail to the present embodiment of the invention, an example of which is illustrated in the accompanying drawings.

(First Embodiment)

Figure 1:
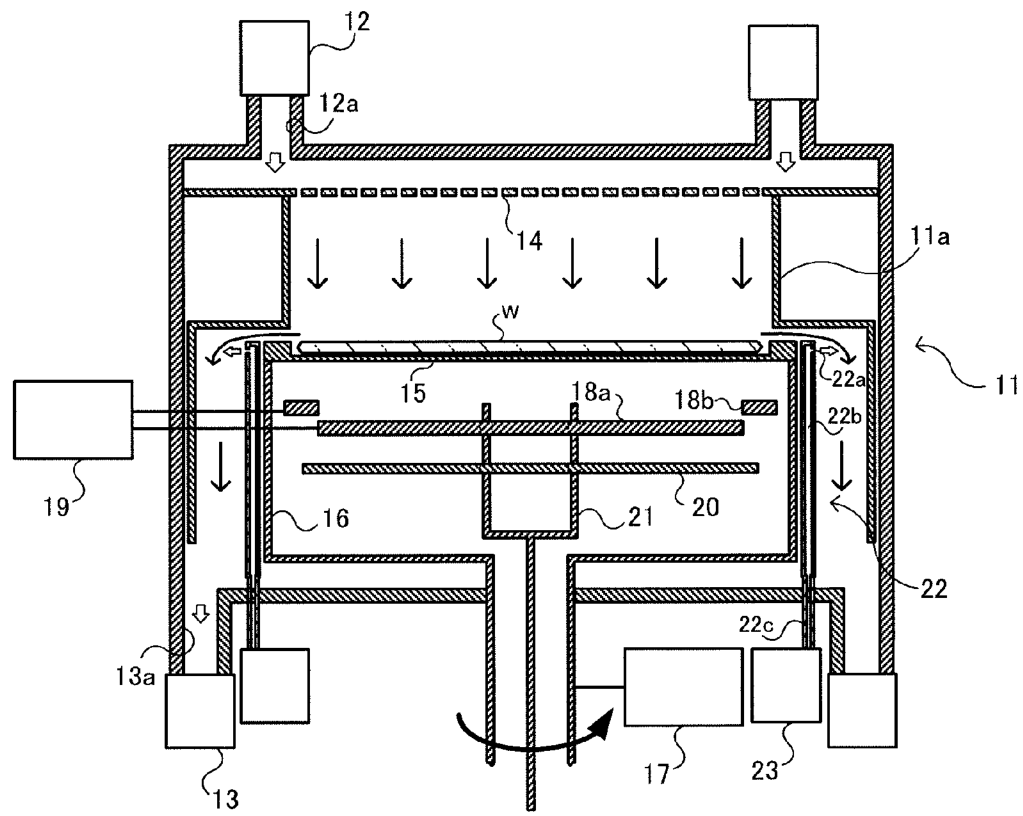
FIG. 1 is a sectional view of a film forming apparatus according to an aspect of the present invention.

FIG. 1 is a sectional view of a film forming apparatus as a manufacturing apparatus for a semiconductor device according to the present embodiment. As shown in FIG. 1, in a reaction chamber 11 in which film forming process of the SiC wafer w of, for example, ϕ150 mm is performed, a quartz cover 11*a* is provided to cover the inner wall of the reaction chamber 11 where necessary.

In the upper part of the reaction chamber 11, gas supply ports 12*a* connected with a process gas supplying mechanism 12 which supplies process gas including source gas and carrier gas is provided. Further, for example, two gas discharge ports 13*a* connected with a gas discharging mechanism 13 for discharging gas so as to control the pressure in the reaction chamber 11 to be constant (normal pressure) is arranged in the lower part of the reaction chamber 11.

A rectifying plate 14 having minute penetrated holes for rectifying and supplying process gas onto the wafer surface are provided under the gas supply ports 12*a*.

Further, in the lower part of the rectifying plates 14, a susceptor 15 is provided which is made of, for example, SiC and which is a supporting member on which a wafer w is placed. The susceptor 15 is placed on a ring 16 which is a rotating member. The ring 16 is connected with a rotary drive control mechanism 17 constituted of a motor and the like through a rotary shaft for rotating the wafer w at a predetermined rotational speed.

Inside the ring 16, heaters including an in-heater 18*a* and an out-heater 18*b* which are made of, for example, SiC and which heat the wafer w are disposed, and are each connected with a temperature control mechanism 19. Further, under the in-heater 18*a* and the out-heater 18*b*, a disk-like reflector 20 is disposed which efficiently heats the wafer w.

Further, a pushing-up pin 21 is provided which has, for example, three pins and which supports the wafer w from the reverse to pierce the susceptor 15, in-heater 18*a* and reflector 20. The pushing-up pin 21 can place the wafer w on the susceptor 15 by placing a carried wafer w above the susceptor 15 and descending the wafer w.

In the outer periphery of the ring 16, a supply ring 22 which supplies cleaning gas is arranged. In the outer periphery of the supply ring 22, a plurality of openings 22*a* are provided at equal intervals to emit cleaning gas. These openings 22*a* are provided below the upper end of the susceptor 15 such that discharged gas from the outer periphery of the wafer w is not blocked. A gas flow path 22*b* is provided in the supply ring 22. The gas flow path 22*b* is provided with, for example, inlet ports 22*c* at two portions, and is connected with a supply unit 23 which has a gas flow meter (not shown).

A SiC epitaxial film is formed on the wafer w using the manufacturing apparatus for a semiconductor device described above.

The wafer w is carried in the reaction chamber 11 by means of a conveying arm (not shown). The wafer w is placed on the susceptor 15 by placing the wafer w on the pushing-up pin 21 and descending the wafer w.

The in-heater 18*a* and out-heater 18*b* are adjusted to a predetermined temperature by the temperature control mechanism 19 to heat the wafer w to, for example, 1650° C. and rotate the wafer w by means of the rotary driving control mechanism 17 at, for example, 900 rpm. Further, process gas the flow rate of which is controlled by the process gas supply mechanism 12 and is mixed is supplied onto the wafer w in a rectified state through the rectifying plates 14. The process gas including source gases which is mixture of, for example, silane gas ($SiH_4$) and propane gas ($C_3H_8$) at the mole ratio of 3:1, diluted to a predetermined concentration by argon gas (Ar) is supplied at, for example, 50 SLM.

Meanwhile, discharged gas including excessive process gas and $H_2$ which is a reaction by-product and the like is discharged downward from between the quartz cover 11*a* and susceptor 15. In addition, if the quartz cover 11*a* is not provided, the process gas is discharged from between the reaction chamber 11 and susceptor 15.

Figure 2:
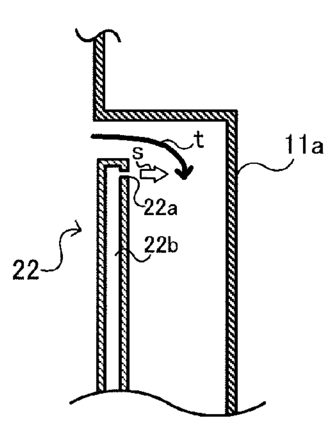
FIG. 2 is a sectional partially expanded view showing emission of cleaning gas according to an aspect of the present invention.

At the same time, as shown in FIG. 2, cleaning gas including mixed gas of, for example, hydrochloric gas (HCl) and argon gas (Ar) which is carrier gas is introduced in by the cleaning gas supply unit 23. Further, the cleaning gas is emitted (gas flow s) in the outer periphery direction from the openings 22*a* through the inlet port 22*c* of the supply ring 22 and gas flow path 22*b*. In this case, the flow rate of cleaning gas is adjusted to 10 vol % or less of the total discharge amount so as not to affect a discharge gas flow t.

Normally, silane gas ($SiH_4$) of the source gas is decomposed at about 600 to 700° C. and unreacted silane gas ($SiH_4$) is thermally decomposed in a peripheral part of the wafer which has a relatively low temperature. Further, thermally decomposed Si and other reaction by-products are deposited in the exhaust system which has a low temperature (the inner wall of the lower part of the reaction chamber 11, the gas discharge port 13*a* and the pump of the gas discharging mechanism).

However, when cleaning gas is supplied below the outer periphery of the wafer w in this manner, Si reacts with HCl and is gasified, so that it is possible to prevent deposition of gas in the exhaust system.

Further, excessive cleaning gas and discharged gas including gasified Si (for example, $SiCl_4$, $SiH_2Cl_2$ or $SiHCl_3$) are discharged through the gas discharging mechanism 13 through the gas discharge port 13*a*, and the pressure inside the reaction chamber 11 is controlled to be constant (for example, normal pressure).

Thus, a SiC epitaxial film is grown on the wafer w.

In this manner, by emitting cleaning gas below the outer periphery of the wafer w when a film is formed, it is possible to prevent deposition of reaction by-products in the exhaust system without stopping the film forming apparatus. Consequently, it is possible to prevent production of particles resulting from depositions without decreasing productivity, prevent a clog in, for example, the pump and precisely control the pressure inside the reaction chamber, and, consequently, improve the yield.

In addition, although argon gas (Ar) is used as carrier gas of cleaning gas, the same gas as carrier gas of process gas is preferably used. For example, when hydrogen gas ($H_2$) is used for process gas, hydrogen gas ($H_2$) is preferably used for cleaning gas.

Figure 3:
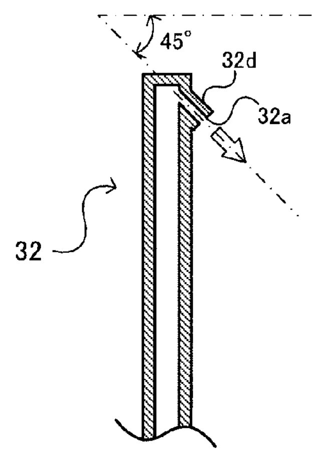
FIG. 3 is a sectional partially expanded view showing an emission direction of cleaning gas according to an aspect of the present invention.

Further, although a plurality of openings which emit cleaning gas are provided at equal intervals in the supply ring, an opening may have a continuous slit shape in the horizontal direction. Further, as shown in FIG. 3, the emitting direction from the opening 32*a* of the supply ring 32 may be adjusted in a predetermined direction by providing a branching part 32*d*. In this case, the emitting direction only needs to adopt the range of 45 degrees from the horizontal line.

(Second Embodiment)

In the present embodiment, although the same manufacturing apparatus for a semiconductor device as that in the first embodiment is used and cleaning gas is emitted below the outer periphery of the wafer likewise, the flow rate of carrier gas to be supplied onto the wafer is increased after stopping supply of source gas and cleaning gas.

Similar to the first embodiment, after a SiC epitaxial film having a predetermined thickness is formed on the wafer w, supplying source gas including, for example, silane gas ($SiH_4$) and propane gas ($C_3H_8$) of process gas is stopped and supplying cleaning gas below the outer periphery of the wafer w is stopped. For example, although carrier gas including argon gas (Ar) is supplied onto the wafer w as is, the flow rate is increased by, for example, 5 to 25%.

Then, the in-heater 18*a* and out-heater 18*b* are turned off, and the temperature of the reaction chamber 11 and the temperature of the wafer w are decreased. After the temperature of the wafer w is decreased to a predetermined temperature, the wafer w is unloaded and a new wafer is loaded.

Thus, by further increasing the flow rate of carrier gas after stopping supply of cleaning gas, it is possible to improve the displacement efficiency of cleaning gas. Consequently, it is possible to prevent the influence of cleaning gas which is left without being displaced, on wafers which are newly loaded, and improve the efficiency to form films.

To prevent the influence on formation of films for the next wafer, the same gas as carrier gas included in process gas is preferably used for carrier gas the flow rate of which is increased after supply of source gas and cleaning gas is stopped. In the present embodiment, although argon gas (Ar) is used, hydrogen gas ($H_2$) is preferably used as is when hydrogen gas ($H_2$) is used for process gas.

(Third Embodiment)

In the present embodiment, although the same manufacturing apparatus for a semiconductor device as that of the first embodiment is used and cleaning gas is emitted below the outer periphery of the wafer likewise, carrier gas is supplied below the outer periphery of the wafer after supply of source gas and cleaning gas is stopped.

Similar to the first embodiment, after a SiC epitaxial film having a predetermined thickness is formed on the wafer w, supplying source gas of process gas is stopped and supplying cleaning gas below the outer periphery of the wafer w is stopped. Then, gas is switched to carrier gas and supplied. If cleaning gas is diluted by carrier gas including, for example, hydrogen gas ($H_2$), carrier gas is supplied as is. In this case, although the flow rate of carrier gas can be appropriately set, the flow rate may be increased by, for example, 5 to 25% to improve the displacement efficiency of cleaning gas.

Thus, by further switching gas to carrier gas after stopping supplying cleaning gas, it is possible to improve the displacement efficiency of cleaning gas. Consequently, it is possible to prevent the influence of cleaning gas which is left without being displaced, on wafers which are newly loaded, and improve the efficiency to form films.

To prevent the influence on formation of films for the next wafer, the same gas as carrier gas included in process gas is preferably used for carrier gas which is switched after supply of source gas and cleaning gas is stopped. Although hydrogen gas ($H_2$) is used in the present embodiment, argon gas (Ar) is preferably used as is when argon gas (Ar) is used for carrier gas of process gas.

(Fourth Embodiment)

In the present embodiment, although the same manufacturing apparatus for a semiconductor device as that in the first embodiment is used and cleaning gas is emitted below the outer periphery of the wafer likewise, the emission speed of cleaning gas is changed.

Similar to the first embodiment, a SiC epitaxial film having a predetermined thickness is formed on the wafer w while supplying cleaning gas below the outer periphery of the wafer w. In this case, although the wafer w is rotated at a predetermined rotational speed, the rotational speed is changed at, for example, 900 rpm to 1200 rpm according to the specification such as a film formation condition or required film thickness, and therefore the flow velocity of a discharged gas flow discharged in the outer periphery direction of the wafer w changes according to the rotational speed.

Figure 4A:
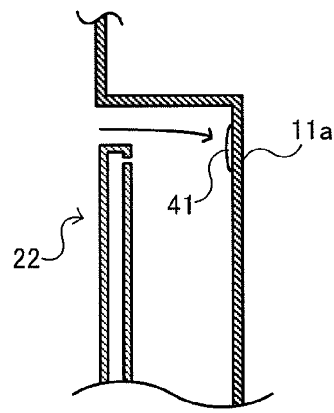
FIG. 4A is a schematic diagram showing the state of a deposition due to a discharged gas flow.
Figure 4B:
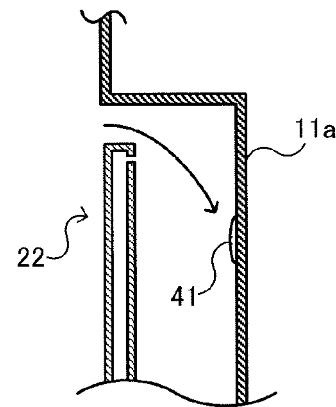
FIG. 4B is a schematic diagram showing the state of a deposition due to a discharged gas flow.

For example, when the rotational speed is fast and flow velocity of the discharged gas flow is fast, as shown schematically in FIG. 4A, a deposition 41 such as a reaction by-product is deposited in a relatively upper part at nearly the height of the susceptor 15 in the inner wall of the reaction chamber 11. By contrast with this, when the rotational speed is slow and flow velocity of the discharged gas flow is slow, as shown schematically in FIG. 4B, the deposition 41 is deposited in a relatively lower part in the inner wall of the reaction chamber 11.

Hence, to supply cleaning gas to the deposited portion, the emission speed of cleaning gas is changed according to the rotational speed. That is, when the supply flow rate of cleaning gas is suppressed, the emission speed decreases, and, when the supply flow rate of cleaning gas is increased, the emission speed increases.

Thus, by changing the emission speed of cleaning gas according to the rotational speed, it is possible to more efficiently remove depositions such as reaction by-products.

In addition, the flow velocity of a discharged gas flow changes according to not only the rotational speed of the wafer w but also the flow rate of process gas and the pressure in the reaction chamber 11. Consequently, the emission speed of cleaning gas may be changed according to variation of these parameters. Further, the emission speed of cleaning gas may be changed per wafer processing or during processing of one wafer.

(Fifth Embodiment)

In the present embodiment, although the same manufacturing apparatus for semiconductor device as that in the first embodiment is used and cleaning gas is emitted below the outer periphery of the wafer likewise, the emission area of cleaning gas is changed to change the emission speed of cleaning gas.

Figure 5:
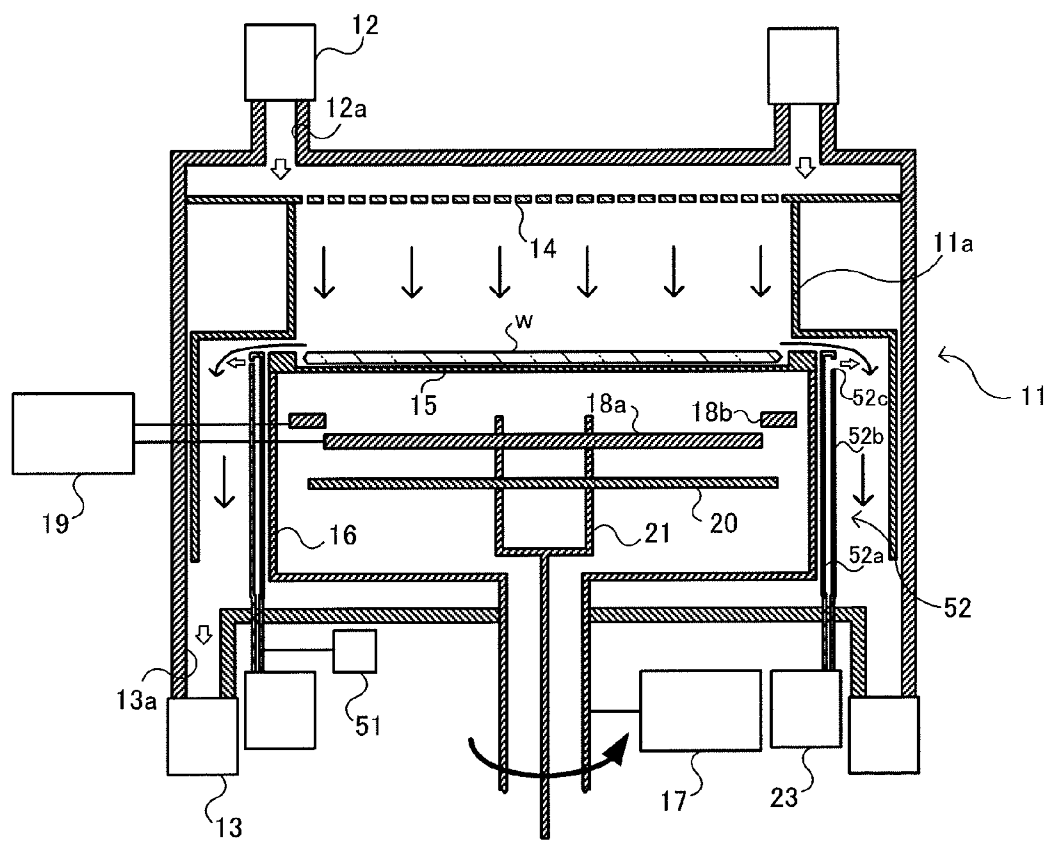
FIG. 5 is a sectional view of a film forming apparatus according to an aspect of the present invention.

FIG. 5 is a sectional view of a film forming apparatus as a manufacturing apparatus for semiconductor device in the present embodiment. Although the same configuration as in FIG. 1 is employed, an emission speed changing mechanism 51 is connected to a supply ring 52 for cleaning gas. The supply ring 52 has an inner wall 52*a* and an outer wall 52*b*, and a slit emission port 52*c* is formed. With this supply ring 52, the emission speed changing mechanism 51 moves the inner wall 52*a* of the supply ring 22 upward and downward, so that it is possible to change the emission area of the emission port 52*c* by 0 to 100% with respect to, for example, the sectional area of the flow path of the supply ring 52 (sectional area between the inner wall 52*a* and outer wall 52*b*). In addition, the same configuration as in FIG. 1 will be assigned the same reference numerals in FIG. 5.

Figure 6:
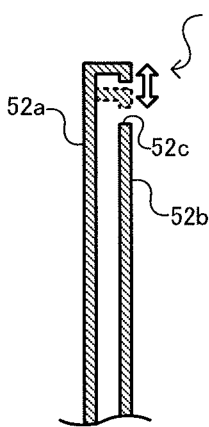
FIG. 6 is a sectional partially expanded view showing emission of cleaning gas according to an aspect of the present invention.

By using this manufacturing apparatus for semiconductor device and supplying cleaning gas below the outer periphery of the wafer w similar to the first embodiment, a SiC epitaxial film having a predetermined thickness is formed on the wafer w. In this case, similar to the fourth embodiment, to supply cleaning gas to the deposited portion, the emission speed changing mechanism 51 moves the inner wall 52*a* of the supply ring 52 upward and downward as shown by the partially expanded sectional view in FIG. 6 according to the rotational speed and changes the emission area of the emission port 52*c* to change the emission speed of cleaning gas. That is, by increasing the emission area by moving the inner wall 52*a* upward, the emission speed decreases, and, by decreasing the emission area by moving the inner wall 52*a* downward, the emission speed increases. In addition, the emission area of cleaning gas may be changed by moving the outer wall 52*b* upward and downward.

Thus, by changing the emission area of cleaning gas according to the rotational speed, it is possible to more efficiently remove depositions such as reaction by-products similar to the fourth embodiment.

(Six Embodiment)

In the present embodiment, although the same manufacturing apparatus for semiconductor device as that in the first embodiment is used, the difference from the first embodiment is that cleaning gas is emitted below the outer periphery of the wafer w while the reaction chamber is cleaned.

Similar to the first embodiment, by emitting cleaning gas below the outer periphery of the wafer w when a film is formed, it is possible to prevent deposition of Si in the exhaust system without stopping the film forming apparatus. However, similar to the wafer w, SiC is deposited on, for example, a susceptor which has nearly the same temperature as the wafer w. Further, even in the exhaust system, SiC which cannot be removed by HCl and reaction by-products such as Si and C are deposited. Further, the reaction chamber is cleaned to remove depositions.

Although the reaction chamber is generally cleaned by supplying cleaning gas similar to process gas, $ClF_3$ gas is, for example, supplied in the present embodiment not only from a gas supply port 12*a* in the upper part but also from openings 22*a* of the supply ring 22 in FIG. 1.

In this case, a film is not formed and therefore the influence on the discharged gas flow need not be taken into account even if gas is emitted from the openings 22*a*, so that it is possible to increase the flow rate compared to emission when a film is formed, make the flow rate equal to or more than, for example, 10 vol % of the total discharge amount and more efficiently remove depositions.

Thus, by emitting cleaning gas below the outer periphery of the wafer w upon cleaning, it is possible to more efficiently remove depositions in the exhaust system. Consequently, it is possible to prevent production of particles of depositions, prevent a clog in, for example, a pump, precisely control the pressure in the reaction chamber and improve the yield.

According to these embodiments, it is possible to form films such as SiC epitaxial films on semiconductor wafers w with high productivity. Further, it is possible to improve the yield of wafers and obtain good element characteristics by applying the present invention to an epitaxial forming procedure for a power semiconductor device and an optical semiconductor device.

Further, although a case has been described in the present embodiment where a SiC single crystal layer (epitaxial film) is formed, the present embodiment is applicable when Si single crystal layers and poly Si layers are formed. Further, the present embodiment is applicable when films other than Si films, for example $SiO_2$ films and $Si_3N_4$ films are formed or is applicable to GaAs layers and compound semiconductors such as GaAlAs and InGaAs.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A manufacturing apparatus for a semiconductor device, comprising:
- a reaction chamber configured to perform film formation on a wafer;
- a process gas supplying mechanism provided in an upper part of the reaction chamber and configured to introduce process gas to an interior of the reaction chamber;
- a gas discharging mechanism provided in a lower part of the reaction chamber and configured to discharge gas from the reaction chamber;
- a supporting member configured to hold the wafer;
- a cleaning gas supplying mechanism provided in an outer periphery of the supporting member and configured to emit cleaning gas at a position lower than an upper end of the supporting member in a direction toward an inner wall of the reaction chamber;
- a heater configured to heat the wafer; and
- a rotary driving mechanism configured to rotate the wafer.

2. The manufacturing apparatus for a semiconductor device according to claim 1, wherein the cleaning gas supplying mechanism comprises:
- a supply unit configured to supply the cleaning gas from a lower part of the reaction chamber; and
- a supply ring including an emission port configured to emit the cleaning gas and an internal flow path of the clearing gas from the supply unit to the emission port.

3. The manufacturing apparatus for a semiconductor device according to claim 2, wherein the emission port has a slit shape.

4. The manufacturing apparatus for a semiconductor device according to claim 2, wherein the cleaning gas supplying mechanism comprises an emission speed control mechanism configured to change an emission speed of the cleaning gas.

5. The manufacturing apparatus for a semiconductor device according to claim 4, wherein the emission speed control mechanism is controlled depending on at least one of the number of rotations of the wafer, a flow rate of the process gas and a pressure in the reaction chamber.

6. The manufacturing apparatus for a semiconductor device according to claim 4, wherein the emission speed control mechanism changes an emission area of the emission port.

7. The manufacturing apparatus for a semiconductor device according to claim 6, wherein the supply ring comprises an inner wall and an outer wall, and changes the emission area by moving the inner wall or the outer wall.

8. The manufacturing apparatus for a semiconductor device according to claim 4, wherein the emission speed control mechanism changes a supply amount of the cleaning gas.

9. The manufacturing apparatus for a semiconductor device according to claim 1, wherein the cleaning gas includes HCl gas.

10. A manufacturing method for a semiconductor device, comprising:
- loading a wafer into a reaction chamber and placing the wafer on a supporting member;
- supplying process gas including source gas and carrier gas on a surface of the wafer;
- rotating and heating the wafer and forming a film on a surface of the wafer; and
- discharging excessive process gas and a reaction by-product below an outer periphery of the wafer, and emitting a cleaning gas at a position lower than an upper end of the supporting member in a direction toward an inner wall of the reaction chamber.

11. The manufacturing method for a semiconductor device according to claim 10, wherein the cleaning gas includes HCl gas.

12. The manufacturing method for a semiconductor device according to claim 10, wherein the carrier gas is at least one of hydrogen gas and inert gas.

13. The manufacturing method for a semiconductor device according to claim 10, further comprising stopping supply of the source gas and the cleaning gas, and increasing a flow rate of the carrier gas supplied onto a wafer.

14. The manufacturing method for a semiconductor device according to claim 13, wherein a flow rate of the carrier gas is increased by 5 to 25%.

15. The manufacturing method for a semiconductor device according to claim 10, further comprising stopping supply of the source gas and the cleaning gas, and supplying carrier gas in an outer periphery direction below an upper end of the supporting member.

16. The manufacturing method for a semiconductor device according to claim 10, wherein an emission speed of the cleaning gas is changed depending on at least one of the number of rotations of the wafer, a flow rate of the process gas and a pressure in the reaction chamber.

17. The manufacturing method for a semiconductor device according to claim 16, wherein the emission speed is changed during processing of the wafer or per wafer.

18. The manufacturing method for a semiconductor device according to claim 16, wherein the emission speed is changed by changing an emission area of an emission port of the cleaning gas.

19. The manufacturing method for a semiconductor device according to claim 16, wherein the emission speed is changed by changing a supply amount of the cleaning gas.

20. A cleaning method of a manufacturing apparatus for a semiconductor device, comprising;

emitting cleaning gas from an upper part of a reaction chamber configured to perform film formation on a wafer, and at a position lower than an upper end of a supporting member configured to support the wafer in a direction toward an inner wall of the reaction chamber to remove a deposition in the reaction chamber.

* * * * *